United States Patent
Park et al.

(10) Patent No.: US 7,875,877 B2
(45) Date of Patent: Jan. 25, 2011

(54) ORGANIC THIN FILM TRANSISTOR AND FLAT PANEL DISPLAY DEVICE HAVING THE SAME

(75) Inventors: Jin-Seong Park, Suwon-si (KR); Min-Chul Suh, Suwon-si (KR); Taek Ahn, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 51 days.

(21) Appl. No.: 11/581,424

(22) Filed: Oct. 17, 2006

(65) Prior Publication Data

US 2007/0090351 A1 Apr. 26, 2007

(30) Foreign Application Priority Data

Oct. 22, 2005 (KR) .................. 10-2005-0099943

(51) Int. Cl.
*H01L 51/30* (2006.01)
(52) U.S. Cl. .................. 257/40; 257/E51.006
(58) Field of Classification Search ............ 257/40
See application file for complete search history.

(56) References Cited

U.S. PATENT DOCUMENTS

| 5,355,235 | A | * | 10/1994 | Nishizawa et al. | 349/43 |
|---|---|---|---|---|---|
| 5,538,827 | A | * | 7/1996 | Muramoto et al. | 430/83 |
| 6,855,951 | B2 | * | 2/2005 | Ong et al. | 257/40 |
| 6,946,676 | B2 | * | 9/2005 | Kelley et al. | 257/40 |
| 2003/0168657 | A1 | * | 9/2003 | Farrand et al. | 257/40 |
| 2004/0150050 | A1 | * | 8/2004 | Yan et al. | 257/368 |
| 2005/0189536 | A1 | * | 9/2005 | Zschieschang et al. | 257/40 |
| 2005/0242342 | A1 | * | 11/2005 | Suh et al. | 257/40 |
| 2005/0263756 | A1 | * | 12/2005 | Yatsunami et al. | 257/40 |
| 2005/0287719 | A1 | * | 12/2005 | Ryu et al. | 438/149 |

OTHER PUBLICATIONS

Chandar Shekar et al. "Growth, Structure, Dielectric and AC Conduction Properties of Solution Grown PVA Films." Jan. 6, 1999. Elsevier Science, 348 pp. 122-129.*

* cited by examiner

*Primary Examiner*—Sue Purvis
*Assistant Examiner*—W. Wendy Kuo
(74) *Attorney, Agent, or Firm*—Stein McEwen, LLP

(57) ABSTRACT

An organic thin film transistor that can control the threshold voltage and reduce leakage current includes: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer. The hole control layer includes a compound having a hole-donor group or a compound having a hole-acceptor group.

9 Claims, 7 Drawing Sheets

ORGANIC THIN FILM TRANSISTOR AND FLAT PANEL DISPLAY DEVICE HAVING THE SAME

CROSS-REFERENCE TO RELATED APPLICATIONS

This application claims the benefit of Korean Patent Application No. 2005-99943, filed on Oct. 22, 2005, in the Korean Intellectual Property Office, the disclosure of which is incorporated herein in its entirety by reference.

BACKGROUND OF THE INVENTION

1. Field of the Invention

Aspects of the present invention relate to an organic thin film transistor and a flat panel display device having the organic thin film transistor, and more particularly, to an organic thin film transistor that can shift a threshold voltage to a desired direction, and a flat panel display device having the organic thin film transistor.

2. Description of the Related Art

Thin film transistors (TFTs) used for flat panel display devices such as a liquid crystal display devices, organic light emitting display devices, or inorganic light emitting display device are used as switching devices that control the operation of each pixel and driving devices that drive the pixel.

TFTs have a semiconductor layer having source and drain regions doped with a high concentration of dopant and a channel region between the source and drain regions, a gate electrode insulated from the semiconductor layer and located on a region corresponding to the channel region, and source and drain electrodes respectively connected to the source and drain regions.

The source and drain electrodes are usually formed of a material having a low work function so as to have smooth current flow. However, due to high contact resistance between the metal and the semiconductor layer, device characteristics are reduced, thereby increasing power consumption.

Organic thin film transistors are advantageous because an organic semiconductor layer can be processed at low temperatures, which means that a plastic substrate can be used. Because of the cost advantages of using a plastic substrate, much active research relating to organic thin film transistors has been recently carried out.

However, there are problems relating to controlling threshold voltage and leakage current in organic thin film transistors.

SUMMARY OF THE INVENTION

Aspects of the present invention provide an organic thin film transistor that can control threshold voltage and can reduce leakage current, and a flat panel display device having the organic thin film transistor.

According to an aspect of the present invention, there is provided an organic thin film transistor comprising: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer and that comprises a compound having a hole-donor group.

According to another aspect of the present invention, there is provided an organic thin film transistor comprising: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer and that comprises a compound having a hole-acceptor group.

According to another aspect of the present invention, there is provided an organic thin film transistor comprising: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer, wherein the hole control layer comprises a compound having a hole-donor group or a hole-acceptor group and wherein the compound is selected such that a curve representing a drain current of the organic thin film transistor with respect to a gate voltage of the organic thin film transistor is shifted in a positive or negative direction and such that a flat band voltage and/or a threshold voltage of the organic thin film transistor are thereby controlled.

According to another aspect of the present invention, there is provided a flat panel display device comprising: an organic thin film transistor that comprises: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer and that comprises a compound having a hole-donor group; and a light emitting diode electrically connected to the organic thin film transistor.

According to another aspect of the present invention, there is provided a flat panel display device comprising: an organic thin film transistor that comprises: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer and that comprises a compound having a hole-acceptor group, and a light emitting diode electrically connected to the organic thin film transistor.

According to another aspect of the present invention, there is provided a flat panel display device comprising: an organic thin film transistor that comprises: a gate electrode; an organic semiconductor layer insulated from the gate electrode; a source electrode and a drain electrode insulated from the gate electrode and electrically connected to the organic semiconductor layer; a gate insulating layer interposed between the gate electrode and the organic semiconductor layer; and a hole control layer that is interposed between the gate insulating layer and the organic semiconductor layer and that comprises a compound having a hole-donor group or a hole-acceptor group and wherein the compound is selected such that a curve representing a drain current of the organic thin film transistor with respect to a gate voltage of the organic thin film transistor is shifted in a positive or negative direction and such that a flat band voltage and/or a threshold voltage of the organic thin film transistor are thereby controlled, and a light emitting device electrically connected to the organic thin film transistor.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
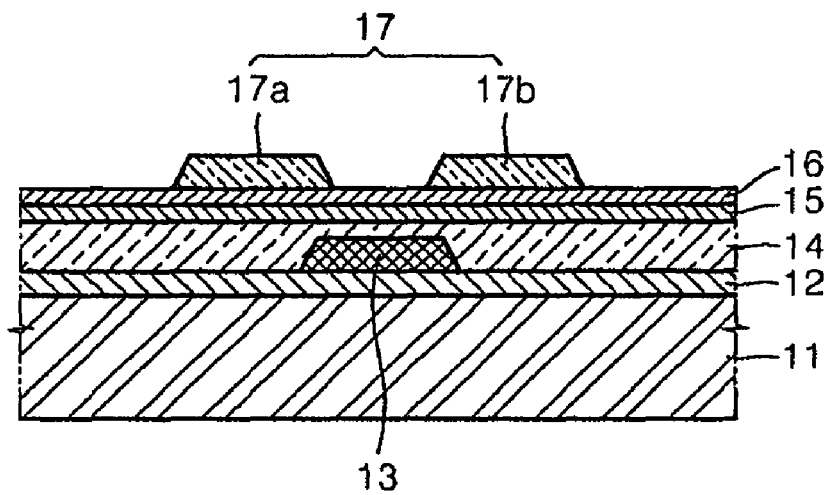
FIG. 1 is a cross-sectional view of an organic thin film transistor according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic thin film transistor according to an embodiment of the present invention.

Referring to FIG. 1, the organic thin film transistor is formed on a substrate 11.

The substrate 11 can be formed of a plastic material such as acryl, polyimide, polycarbonate, polyester, mylar, etc., but is not limited thereto. The substrate 11 can also be formed of a metal such as stainless steel (SUS), tungsten, etc. and glass, and may be flexible.

An insulating layer 12 such as a barrier layer and/or a buffer layer can be formed on an upper surface of the substrate 11 to prevent the diffusion of impurity ions, to prevent the penetration of moisture or external air, and to planarize the surface of the substrate 11. FIG. 1 shows the insulating layer 12 formed on the upper surface of the substrate 11, but the present invention is not limited thereto. That is, the insulating layer 12 can be formed on a lower surface of the substrate 11, or may not be formed at all if it is not necessary in a particular context.

A gate electrode 13 having a predetermined pattern is formed on the substrate 11. The gate electrode 13 can be formed of a metal such as Au, Ag, Cu, Ni, Pt, Pd, Al, Mo, Al:Nd alloy, Mo:W alloy, or an alloy of these metals in a single or multi-layers. The gate electrode 13 can also be formed of a polymer paste in which a metal powder is mixed or can be formed of a conductive polymer.

A gate insulating layer 14 covering the gate electrode 13 is formed on the insulating layer 12. The gate insulating layer 14 can be formed in a single or multilayer structure, and can be formed of an organic material, an inorganic material, and an organic/inorganic composite material.

An organic insulating film can be formed of a polymer, such as, for example, an ordinary polymer such as poly methylmethacrylate (PMMA) or polystyrene (PS), a polymer derivative having phenol group, an acryl polymer, an imide polymer, an arylether polymer, an amide polymer, a fluorine polymer, a p-xylene polymer, a vinylalcohol polymer, or a blend of theses materials.

An inorganic insulating film can be formed of $SiO_2$, SiNx, SiON, $Al_2O_3$, $TiO_2$, $Ta_2O_5$, $HfO_2$, $ZrO_2$, barium strontium titanate (BST), or lead zirconium titanate (PZT).

When the organic thin film transistor is to be used in a flexible electronic device, the gate insulating layer 14 may include an organic material that can be formed in a liquid phase.

A hole control layer 15 is formed on an upper surface of the gate insulating layer 14. An organic semiconductor layer 16 is formed on the hole control layer 15, and source and drain electrodes 17a and 17b are formed on the organic semiconductor layer 16.

The organic semiconductor layer 16 can be formed of a P-type organic semiconductor material or an N-type organic semiconductor material. A P-type or N-type active layer can be formed by doping a P-type or N-type dopant into the organic semiconductor layer 16.

Examples of a P-type organic semiconductor material include pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiopenevinylene and its derivatives, a polythiophene-hetero ring aromatic copolymer and its derivatives, an oligoacene of naphthalene and its derivatives, and alpha-5-thiophene oligothiophene and its derivatives. Examples of an N-type organic semiconductor material include phthalocyanine that does not include a metal and its derivatives, a fluorinated compound, a quinodimethane compound, pyromelliticdianhydride and its derivatives, and pyromellitic diimide and its derivatives. However, the organic semiconductor material is not limited to these examples.

As depicted in FIG. 1, the source and drain electrodes 17a and 17b can overlap a portion of the gate electrode 13, but the present invention is not limited thereto. The source and drain electrodes 17a and 17b can be formed of a metal containing a noble metal having an electron voltage of 5.0 eV or more, taking into consideration the work function with respect to the material that forms the organic semiconductor layer. In consideration of this condition, the source and drain electrodes 17a and 17b can be formed of Au, Pd, Pt, Ni, Rh, Ru, Ir, Os, or an alloy of these metals, in a single layer or multiple layers, but the present invention is not limited thereto. As specific non-limiting examples, the source and drain electrodes may be formed of Au, Pd, Pt, or Ni. Also, the source and drain electrodes 17a and 17b can be formed of a polymer paste in which a metal powder is mixed or can be formed of a conductive polymer.

The hole control layer 15 interposed between the gate insulating layer 14 and the organic semiconductor layer 16 is formed of a material that contains a compound having a hole-donor group or a hole-acceptor group according to the type of channel or the direction of the threshold voltage that is to be directed. In the present embodiment, the function and action of the hole control layer 15 will now be described in detail with reference to FIGS. 2 through 5.

Figure 2:
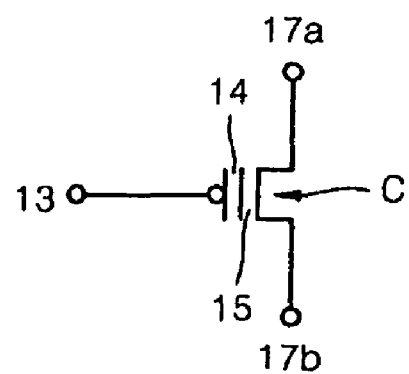
FIG. 2 is a schematic circuit of a P type organic thin film transistor according to an embodiment of the present invention.
Figure 3:
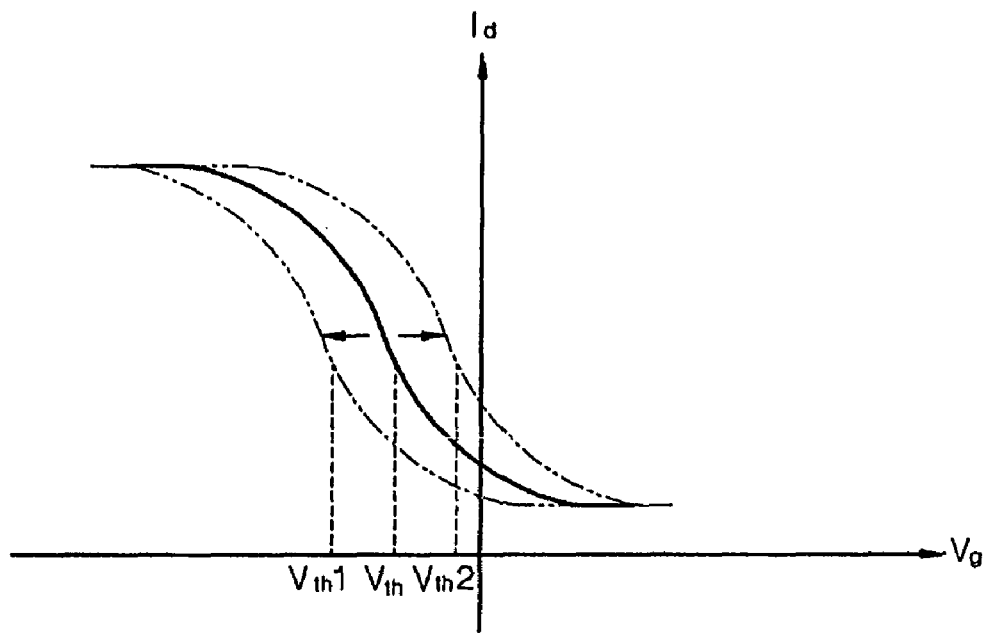
FIG. 3 is a graph showing a relationship between gate voltage Vg and drain current of the P type organic thin film transistor of FIG. 2.

FIG. 2 is a schematic circuit of a P type organic thin film transistor according to an embodiment of the present invention, and FIG. 3 is a graph showing a relationship between the gate voltage Vg and the drain current of the P type organic thin film transistor of FIG. 2.

Referring to FIG. 2, the gate insulating layer 14 is interposed between the gate electrode 13, the source and drain electrodes 17a and 17b, and the channel C. The hole control layer 15 is interposed between the gate insulating layer 14 and the channel C.

As depicted in FIG. 3, when a negative (−) voltage lower than a threshold voltage Vth is applied to the gate electrode 13 of the P-type organic thin film transistor of FIG. 2, a current $I_d$ flows from the source electrode 17a to the drain electrode 17b.

As depicted in FIG. 3, the curve of the drain current $I_d$ with respect to the gate voltage Vg and the position of the threshold voltage Vth can be shifted to the left or right direction by interposing the hole control layer 15 between the gate insulating layer 14 and the channel C.

That is, when the hole control layer 15 is formed of a compound that contains a hole-donor group, a gate voltage lower than Vth must be applied to turn on the organic TFT. Accordingly, the curves of the drain current $I_d$ with respect to the gate voltage Vg and the position of the threshold voltage Vth are shifted to the left and a lower threshold voltage Vth1 can be obtained. Leakage current when the organic TFT is turned off can be prevented.

Of course, depending on the desired circuit condition, the organic TFT can be formed to turn on at a gate voltage higher than Vth by forming the hole control layer 15 including a compound having a hole acceptor group. When this is done, the curve of the drain current $I_d$ with respect to the gate voltage Vg and the position of the threshold voltage Vth are shifted to the right and a higher threshold voltage Vth2 can be obtained.

Figure 4:
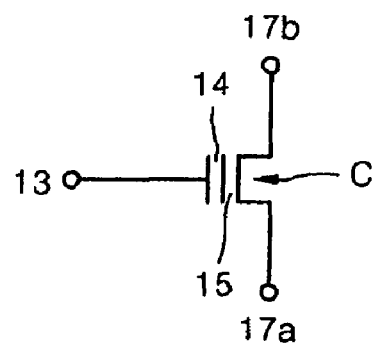
FIG. 4 is a schematic circuit of an N type organic thin film transistor according to an embodiment of the present invention.
Figure 5:
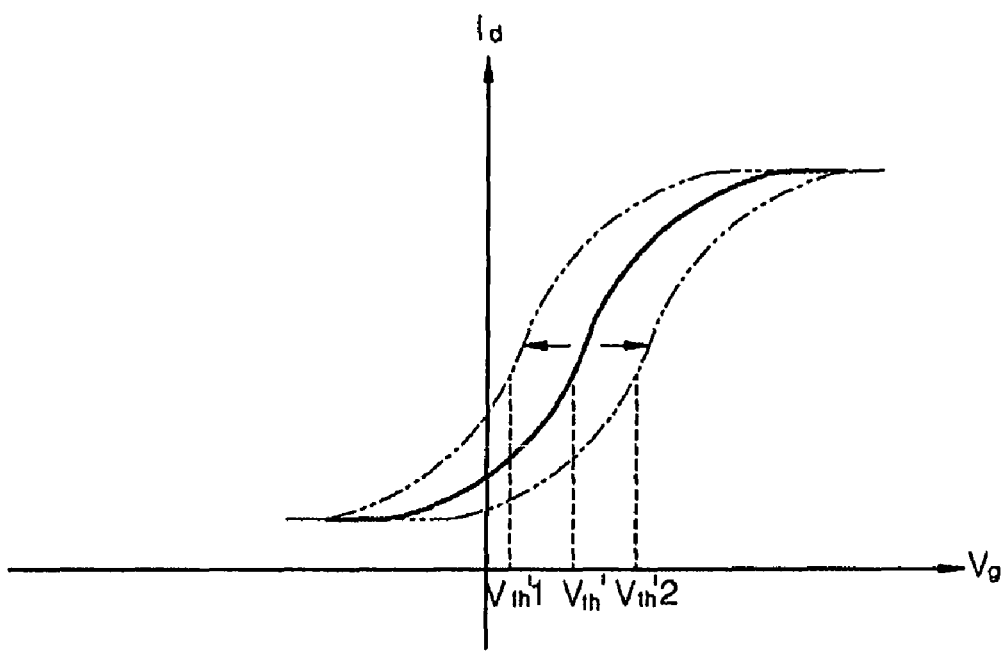
FIG. 5 is a graph showing a relationship between gate voltage Vg and drain current of the N type organic thin film transistor of FIG. 4.

FIG. 4 is a schematic circuit of an N type organic thin film transistor according to an embodiment of the present invention, and FIG. 5 is the graph showing a relationship between the gate voltage Vg and the drain current of the N type organic thin film transistor of FIG. 4.

In, As depicted in FIG. 5, when a positive voltage(+) greater than a threshold voltage Vth' is applied to the gate electrode 13 of the N type organic thin film transistor of FIG. 4, a current $I_d$ flows from the drain electrode 17b to the source electrode 17a.

Also as depicted in FIG. 5, the curve of the drain current $I_d$ with respect to the gate voltage Vg and position of the threshold voltage Vth' can be shifted to the left or right by interposing the hole control layer 15 between the gate insulating layer 14 and the channel C.

That is, when the hole control layer 15 is formed of a compound containing a hole-donor group, the organic TFT can be turned on at a further lower gate voltage. Accordingly, the curve of the drain current $I_d$ with respect to the gate voltage Vg and the position of the threshold voltage Vth' are shifted to the right. Accordingly, a further lower threshold voltage Vth'1 can be obtained.

Also, the organic TFT can be formed to turn on at a further higher gate voltage by forming the hole control layer 15 including a compound having a hole acceptor group. When this is done, the curves of the gate voltage Vg and the drain current $I_d$ and the threshold voltage Vth' are shifted to the right. Accordingly, a further higher threshold voltage Vth'2 can be obtained.

Whether the hole control layer 15 is formed of a compound containing a hole-donor group or a compound containing a hole-acceptor group can be determined according to the device and circuit that use the organic thin film transistor. In other words, characteristics of a device and circuit that use the organic thin film transistor can be selected at the time that the organic thin film transistor is fabricated by selecting whether to form the hole control layer 15 containing a hole donor group or a hole acceptor group.

The compound that includes a hole-donor group can be an aromatic compound that includes at least one hole-donor group selected from the group consisting of —NO$_2$, —CN, —C(=O)—, —COO—, —C(=O)—O—C(=O)—, —CONH—, —SO—, —SO$_2$—, —C(=O)—C(=O)—, =N—, —F, —Cl, —I, a C$_{1-10}$ haloalkyl group, and a C$_{5-10}$ haloaryl group.

The C$_{1-10}$ haloalkyl group is an alkyl group having 1-10 carbon atoms, in which at least one hydrogen atom is substituted by a halogen, and can be, for example, a methyl group, ethyl group, n-propyl group, i-propyl group, butyl group, pentyl group, or hexyl group. For example, the C$_{1-10}$ haloalkyl group can be a C$_{1-5}$ haloalkyl group.

The C$_{5-10}$ haloaryl group is an aryl group having 5-10 carbon atoms, in which at least one hydrogen atom is substituted by a halogen. The aryl group is generated from an aromatic ring system, such as, for example, a phenyl group or a naphthyl group.

The term "aromatic compound" is used with its commonly understood meaning. For example, the aromatic compound may be an unsaturated carbocyclic compound or an unsaturated heterocyclic compound. The aromatic compound includes at least one electron-acceptor group, includes at least one ring system selected from the group consisting of 5-ring, 6-ring, and 7-ring carbocyclic ring systems, and a heterocyclic ring. The carbocyclic rings or the heterocyclic rings can combine to each other, can be single bonded or connected to an ethenylene group, or can have a coordinate bond with a metal element, such as, for example, Al. The term "heterocyclic ring" refers to a carbocyclic ring in which at least one carbon atom is substituted by at least one selected from the group consisting of N, S, P, and O.

As described above, the compound that includes a hole-donor group can be an aromatic compound that includes a hole-donor group. For example, the compound can be formed by substituting the hole-donor group for at least one hydrogen atom of the aromatic compound or by substituting the hole-donor group for a C, N, S, P, or O atom that constitute the ring of the aromatic compound. Also, a hetero atom of a heterocyclic ring of the aromatic compound can itself serve as a hole-donor group.

More specifically, the aromatic compound having the hole-donor group can be a compound that contains at least one hole-donor group. For example, the aromatic compound can be a fluorenone compound, an aniline compound, a benzene compound, a naphthalene compound, a biphenyl compound, a stilbene compound, an anthracene compound, a dianhydride compound, an anhydride compound, an imide compound, a phenazine compound, or a quinoxaline compound.

Examples of compounds having the hole-donor group are 2,4,7-trinitrofluorenone, 4-nitroaniline, 2,4-dinitroaniline, 5-nitroanthranilonitrile, 2,4-dinitrodiphenylamine, 1,5-dinitronaphthalene, 4-nitrobiphenyl, 4-dimethylamino-4'-nitrostilbene, 1,4-dicyanobenzene, 9,10-dicyanoanthracene, 1,2,4,5-tetracyanobenzene, 3,5-dinitrobenzonitrile, 3,4,9,10-perylenetetracarboxylic dianhydride, N,N'-bis(di-t-butylphenyl)-3,4,9,10-perylenedicarboxyimide), tetrachlorophthalic anhydride, tetrachlorophthalonitrile, tetrafluoro-1,4-benzoquinone, naphthoquinone, anthraquinone, phenanthrenequinone, 1,10-phenanthroline-5,6-dione, phenazine, quinoxaline, 2,3,6,7-tetrachloroquinoxaline, tris-8-hydroxyquinoline aluminum ($Alq_3$), but the present invention is not limited thereto.

The compound that contains the hole-acceptor group can be an aromatic compound or vinyl compound that includes at least one hole-acceptor group selected from the group consisting of hydrogen, $C_{1-10}$ alkyl group, $C_{5-10}$ aryl group, —$NR_2$ group, —$OR_3$ group, and —$SiR_4R_5R_6$ group. $R_1$, $R_2$, $R_3$, $R_4$, $R_5$, and $R_6$ independently can be hydrogen, a $C_{1-10}$ alkyl group, or a $C_{5-10}$ aryl group.

The $C_{1-10}$ alkyl group is an alkyl group having 1-10 carbon atoms, for example, methyl group, ethyl group, n-propyl group, i-propyl group, butyl group, pentyl group, or hexyl group. For example, the $C_{1-10}$ alkyl group can be a $C_{1-5}$ alkyl group.

The term "$C_{5-10}$ aryl group" refers to a group derived from an aromatic ring system having 5-10 carbon atoms, such as, for example, a phenyl group or a naphthyl group.

The term "aromatic compound" is used with its commonly understood meaning, as mentioned above. For example, the aromatic compound may be an unsaturated carbocyclic compound or an unsaturated heterocyclic compound. The aromatic compound includes at least one electron-donor group, includes at least one selected from the group consisting of 5-ring, 6-ring, and 7-ring carbocyclic ring system, and heterocyclic ring. The carbocyclic rings or the heterocyclic rings can combine to each other, or can be connected to each other by a single or double bond. The heterocyclic ring is a carbocyclic ring in which at least one carbon atom is substituted by at least one selected from the group consisting of N, S, P, and O. The vinyl compound denoted compounds that include vinyl group s.

More specifically, the aromatic compound having the hole-acceptor group can be a compound that contains at least one hole-acceptor group. For example, the aromatic compound can be a thiopene compound, an ethylene compound, an azulene compound, a pentadiene compound, or a fulvalene compound.

Non-limited examples of a compound having the above hole-acceptor group can be poly(3,4-ethylene-dioxythiophene, tetraphenylethylene, azulene, 1,2,3,4-tetraphenyl-1,3-cyclopentadiene, and bis(ethylenedithio)tetrathiafulvalene.

The hole control layer 15 can be formed by various methods. That is, the hole control layer 15 can be directly formed by depositing or spin coating using a compound that includes the above materials (that is, a compound having a hole-donor group or a hole-acceptor group). Alternatively, the hole control layer can be formed as a self-assembly monolayer (SAM) by applying a material (having a hole-donor group or a hole-acceptor group) that is capable of self-assembling to form a monolayer. Such material may be applied by known methods of deposition or coating, such as by dipping in a solution.

In the organic thin film transistor according to the present embodiments as described above, the curves of the gate voltage Vg and the drain current $I_d$ can be shifted in a positive or a negative direction. Accordingly, a flat band voltage and a threshold voltage can be shifted to a desired direction, and also, a desired operating voltage can be obtained.

Although a bottom gate type transistor is depicted in FIG. 1, it is to be understood that the organic thin film transistor is not limited to this structure. In particular, the organic thin film transistor according to aspects of the present invention can be stacked in various other structures, examples of which are shown in FIGS. 6-8, as described below.

Figure 6:
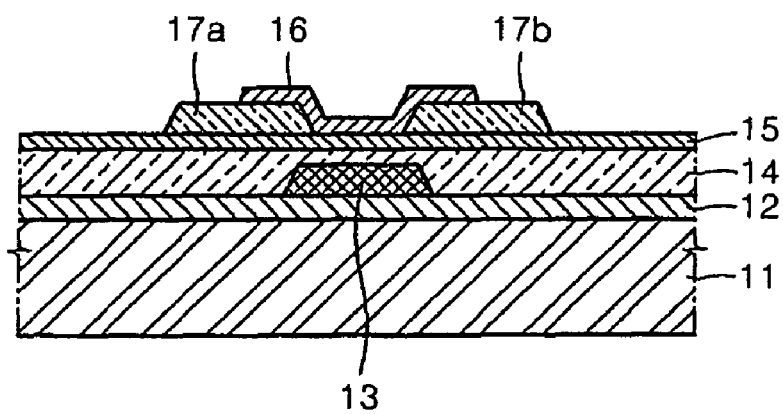
FIGS. 6 through 8 are cross-sectional views of organic thin film transistors according to other embodiments of the present invention.

FIG. 6 is a cross-sectional view of an organic thin film transistor according to another embodiment of the present invention. Referring to FIG. 6, after forming source and drain electrodes 17a and 17b on a hole control layer 15, an organic semiconductor layer 16 is formed on the source and drain electrodes 17a and 17b. In other words, in this embodiment, the organic semiconductor layer 16 is formed after the source and drain electrodes 17a and 17b are formed and the organic semiconductor layer 15 contacts the hole control layer 15 in a region between the source and drain electrodes 17a and 17b. In FIG. 6, a patterned organic semiconductor layer 16 is depicted, but the present invention is not limited thereto. That is, after the organic semiconductor layer 16 is formed on an entire surface of the resultant product, a groove or a deformation region can be formed between the source and drain electrodes 17a and 17b.

Figure 7:
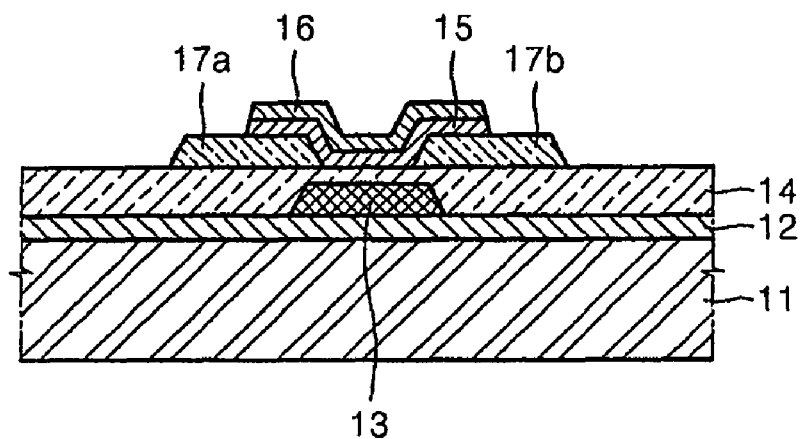
Figure 8:
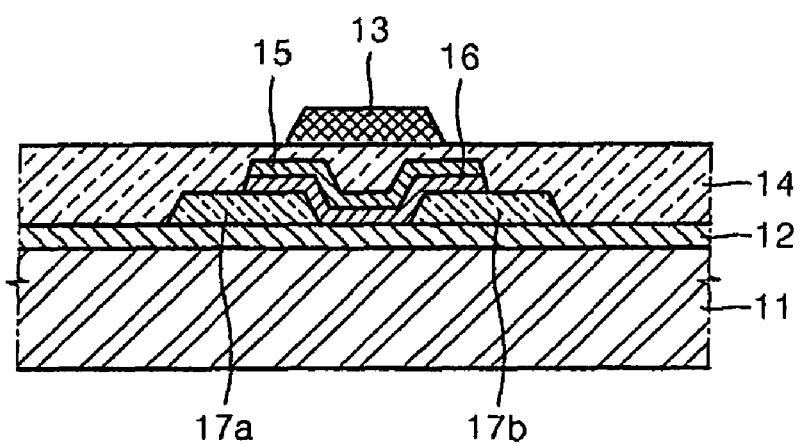

FIG. 7 is a cross-sectional view of another bottom gate type organic thin film transistor. Referring to FIG. 7, after source and drain electrodes 17a and 17b are formed on a gate insulating layer 14, a hole control layer 15 and an organic semiconductor layer 16 are sequentially formed on the source and drain electrodes 17a and 17b and the gate insulating layer 14. The hole control layer 15 and the organic semiconductor layer 16 are etched together to pattern as depicted in FIG. 7 using laser ablation technology (LAT).

The organic thin film transistor according to aspects of the present invention can also be a top gate type organic thin film transistor, in which a gate electrode is located on an organic semiconductor layer.

FIG. 8 is a cross-sectional view of a top gate type organic thin film transistor. Referring to FIG. 8, after source and drain electrodes 17a and 17b are formed on an insulating layer 12, an organic semiconductor layer 16 and a hole control layer 15 are sequentially formed on the source and drain electrodes 17a and 17b and the insulating layer 12. The organic semiconductor layer 16 and the hole control layer 15 are etched together to pattern as depicted in FIG. 8 using a laser etching method, and then a gate insulating layer 14 covering the resultant product is formed, and a gate electrode 13 is formed on the gate insulating layer 14. A top gate type organic thin film transistor can have various modifications and is not limited to the top gate type organic film transistor shown in FIG. 8.

As described above, an organic thin film transistor according to aspects of the present invention can be mounted on each sub-pixel, or a driver circuit (not shown) or other electronic circuits on which images are not displayed.

Figure 9:
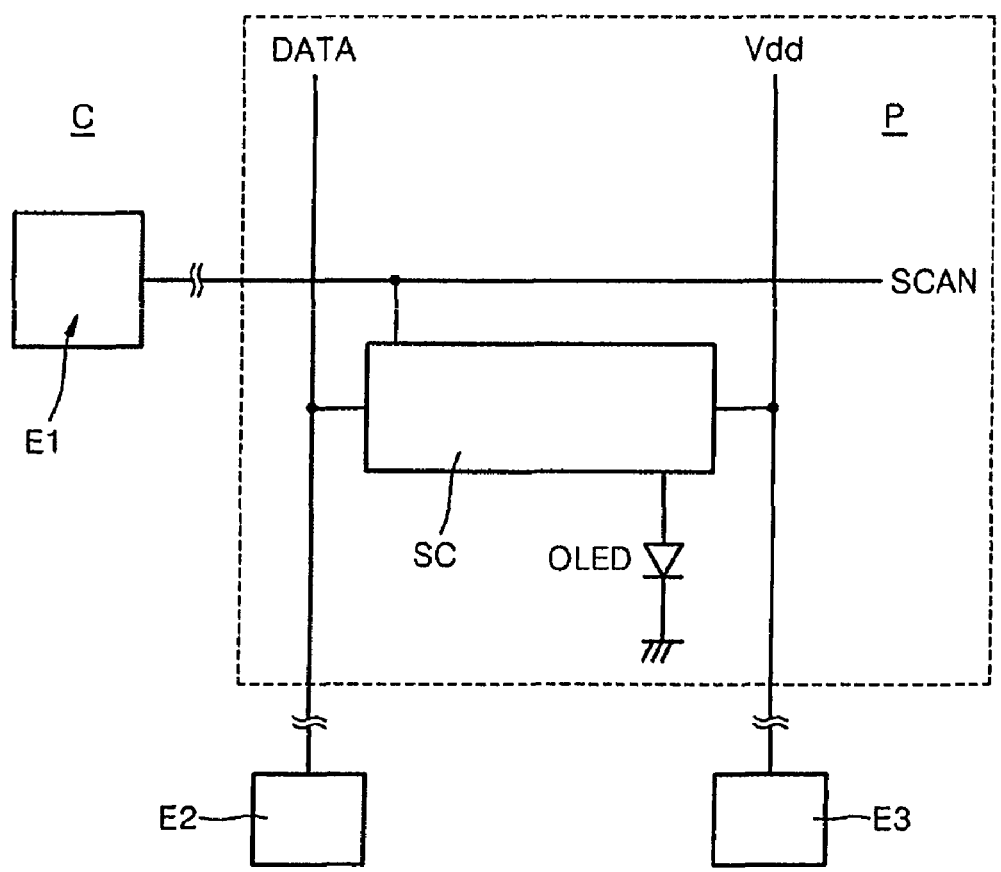
FIG. 9 is a schematic circuit of an organic light emitting display device that includes an organic thin film transistor according to an embodiment of the present invention.

FIG. 9 is a schematic circuit diagram of an organic light emitting display device (OLED), which is one type of flat panel display devices to which an organic thin film transistor according to an embodiment of the present invention can be applied. FIG. 9 includes a pixel circuit SC of a unit pixel P and electronic devices E1, E2, and E3 connected to the pixel circuit SC.

Referring to FIG. 9, each pixel P includes a data line ("Data"), a scan line ("Scan"), and a Vdd power line ("Vdd") that supplies power for driving the organic light emitting device.

The pixel circuit SC of each of the pixels is electrically connected to the data line Data, the scan line Scan, and the Vdd power line Vdd, and controls the light emission of the OLED.

A circuit region C can include a first electronic device E1 electrically connected to the scan line Scan, a second electronic device E2 electrically connected to the data line Data, and a third electronic device E3 electrically connected to the Vdd power line Vdd. The first electronic device E1 can be a scan driver, the second electronic device E2 can be a data driver, and the third electronic device E3 can be a Vdd power source. The first, second, third electronic devices E1, E2, and E3 together with the pixel circuit SC can be formed on a substrate by printing. An additional device can be mounted on the substrate and can be connected to the pixel circuit SC through a connection medium such as cables.

Furthermore, in the circuit region C, various electronic devices for forming images on a pixel region P by controlling the OLED can further be disposed. Also, terminal pads connected to external circuits can be disposed in the circuit region C.

The aforementioned organic thin film transistor according to aspects of the present invention can be mounted on a pixel circuit SC in a flat panel display device having the circuit of FIG. 9, and also, can be mounted on each of the first electronic device E1, the second electronic device E2, and the third electronic device E3.

Figure 10:
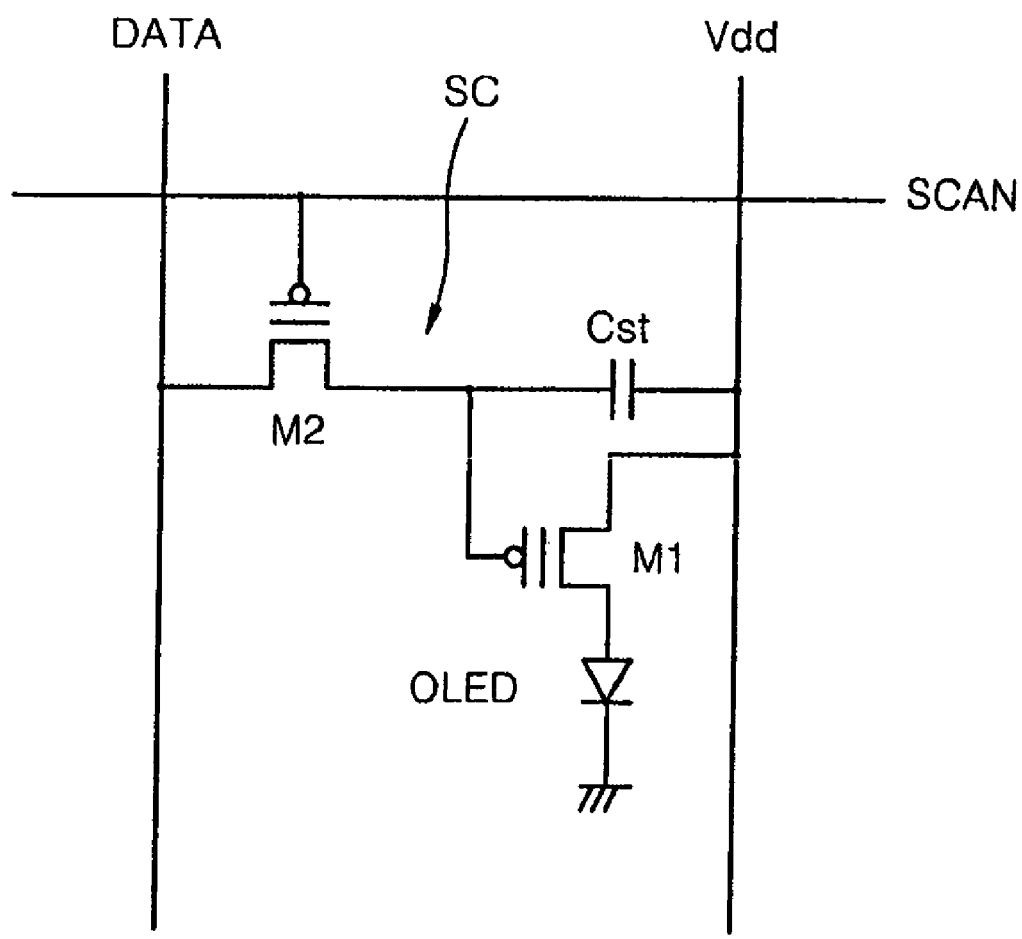
FIG. 10 is a detailed diagram of the pixel circuit SC of the pixel of FIG. 9.

FIG. 10 is a detailed circuit diagram of the pixel circuit SC of the pixel of FIG. 9. The pixel circuit SC includes two thin film transistors (TFTs) M1 and M2 and one capacitor unit Cst.

Referring to FIG. 10, each pixel of an AM type organic light emitting device according to an embodiment of the present invention includes at least two TFTs, which are a switching TFT M2 and a driving TFT M1, respectively, a capacitor unit Cst, and an OLED.

The switching TFT M2 is turned on or off by a scan signal applied to a scan line Scan to transmit a data signal applied to the data line Data to the storage capacitor unit Cst and the driving TFT M1. The switching device according to the present embodiment is not limited to the switching TFT M2 depicted in FIG. 10, and can include a switching circuit having a plurality of thin film transistors and capacitors, or can further include a circuit that compensates the threshold voltage Vth of the driving TFT M1 or a circuit that compensates the voltage drop of the Vdd power line Vdd.

The driving TFT M1 determines the current input to the OLED according to a data signal transmitted through the switching TFT M2.

The capacitor unit Cst stores the data signal transmitted from the switching TFT M2 for one frame period.

In the circuit diagram in FIG. 10, the driving TFT M1 and the switching TFT M2 are depicted as P type organic thin film transistors, but the present invention is not limited thereto. That is, at least one of the driving TFT M1 and the switching TFT M2 can be an N type organic thin film transistor. Also, the number of thin film transistors and capacitors are not limited what is shown in FIG. 10 and can be increased as necessary.

Figure 11:
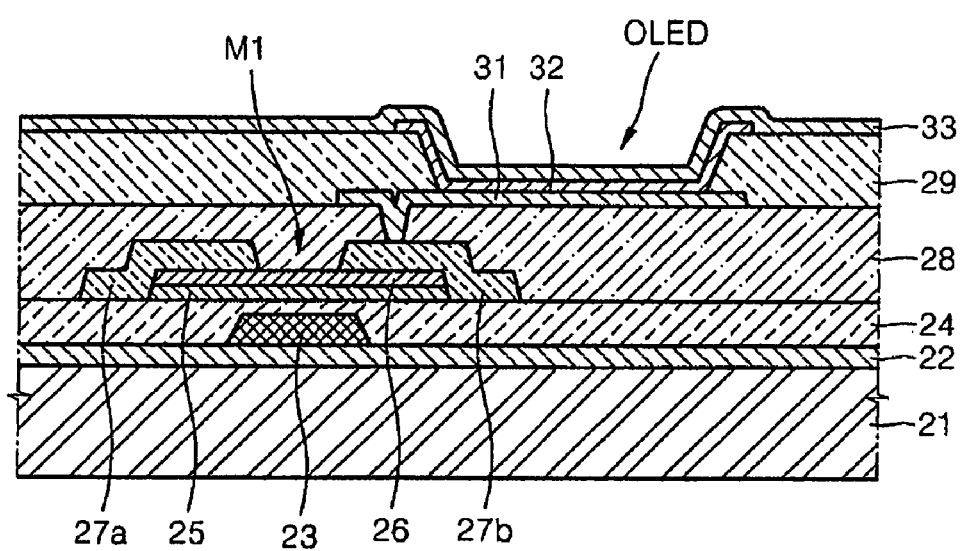
FIG. 11 is a cross-sectional view of the driving TFT M1 and the organic light emitting diode (OLED) of FIG. 10.

According to aspects of the present invention, the above circuit diagram can be realized in a structure depicted in cross-section in FIG. 11. FIG. 11 only shows the driving TFT M1 and the OLED of FIG. 10. The switching TFT M2 can also be formed with the same structure as the driving TFT M1.

Referring to FIG. 11, the TFT depicted in FIG. 1 is formed on an insulating film 22 of a substrate 21. The description of the TFT will not be repeated.

After the TFT is formed, a planarizing film 28 covering the TFT is formed. The planarizing film 28 can be formed in a single layer or multiple layers using an organic material, an inorganic material, or an organic/inorganic composite material.

A pixel electrode 31, which is one electrode of the OLED, is formed on the planarizing film 28 and is connected to the drain electrode 27b. A pixel defining film 29 is formed on the planarizing film. After a predetermined opening is formed in the pixel defining film 29, an organic light emitting film 32 of the OLED is formed in the opening.

The OLED displays images by emitting red, green, or blue light according to the current flow. The OLED includes the pixel electrode 31 connected to a drain electrode 27b of the driving TFT M1, a facing electrode 33 covering the entire pixel, and an organic light emitting film 32 that emits light between the pixel electrode 31 and the facing electrode 33.

The pixel electrode 31 and the facing electrode 33 are insulated from each other by the organic light emitting film 32 and apply voltages of opposite polarity to the organic light emitting film 32 so that the organic light emitting film 32 emits light.

The organic light emitting film 32 can be a small molecular weight organic material film or a polymer organic material film. If the organic light emitting film 32 is a small molecular weight organic film, the organic light emitting film 32 can be formed in a single or a composite structure by stacking a hole injection layer (HIL), a hole transport layer (HTL), an emission layer (EML), an electron transport layer (ETL), and an electron injection layer (EIL). Organic materials that can be used for forming the organic light emitting film 32 includes copper phthalocyanine (CuPc), N,N'-di(naphthalene-1-yl)-N,N'-diphenyl-benzidine (NPB), or tris-8-hydroxyquinoline aluminum ($Alq_3$), but the present invention is not limited thereto. The small molecular weight organic film can be formed by an evaporation method.

If the organic light emitting film 32 is a polymer organic film, the organic light emitting film 32 can have a structure that includes an HTL and an EML. The polymer HTL can be formed of poly-(2,4)-ethylene-dihydroxy thiophene (PEDOT), and the light emitting layer can be formed of polyphenylenevinylene (PPV) and polyfluorene group polymers using screen printing or inkjet printing.

However, the organic light emitting film 32 is not limited to the above, and can be formed of other materials and in other structures. In FIG. 11, it is depicted that the organic light emitting film 32 is located in a specific region to provide a patterned light emitting layer. The organic light emitting film 32 can be formed to cover common layers that have nothing to do with the color of the pixel, such as, for example HIL, HTL, ETL, and EIL layers.

The pixel electrode 31 may function as an anode electrode and the facing electrode 33 may function as a cathode electrode. However, the polarity of the pixel electrode 31 and the facing electrode 33 may be reversed.

The organic light emitting display device according to aspects of the present invention is not limited to the above structure, and various other structures can be applied.

The organic TFT according to aspects of the present invention may also be used in a liquid crystal device. In the case of a liquid crystal device, the manufacturing of a lower substrate of the liquid crystal device is completed by forming a lower orientation film (not shown) covering the pixel electrode.

In an organic thin film transistor according to aspects of the present invention, such as, for example, an organic TFT mounted on a circuit of a flat panel display device, the curve of the drain current $I_d$ with respect to gate voltage Vg and can be shifted in a positive or a negative direction by including a hole control layer. Accordingly, the flat band voltage and the threshold voltage can be controlled to a desired direction, and the operating voltage can be controlled to a desired level. Also, a leakage current problem of a thin film transistor can be solved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic thin film transistor comprising:
   a gate electrode;
   an organic semiconductor layer insulated from the gate electrode;
   a source electrode and a drain electrode insulated from the gate electrode and electrically connected to the organic semiconductor layer;
   a first gate insulating layer interposed between the gate electrode and the organic semiconductor layer; and
   a second layer interposed between and entirely contacting the gate insulating layer and the organic semiconductor layer and comprising a compound having a hole-donor group, wherein the second layer is not interposed between the organic semiconductor layer and the source electrode or between the organic semiconductor layer and the drain electrode, and wherein the compound having the hole-donor group is at least one selected from the group consisting of 2,4,7-trinitrofluorenone, 4-nitroaniline, 2,4-dinitroaniline, 5-nitroanthranilonitrile, 2,4-dinitrodiphenylamine, 1,5-dinitronaphthalene, 4-nitrobiphenyl, 4-dimethylamino-4'-nitrostilbene, 1,4-dicyanobenzene, 9,10-dicyanoanthracene, 1,2,4,5-tetracyanobenzene, 3,5-dinitrobenzonitrile, 3,4,9,10-perylenetetracarboxylic dianhydride, N,N'-bis(di-t-butylphenyl)-3,4,9,10-perylenedicarboxyimide), tetrachlorophthalic anhydride, tetrachlorophthalonitrile, tetrafluoro-1,4-benzoquinone, naphthoquinone, phenanthrenequinone, 1,10-phenanthroline-5,6-dione, phenazine, quinoxaline, 2,3,6,7-tetrachloroquinoxaline, and tris-8-hydroxyquinoline aluminum ($Alq_3$).

2. The organic thin film transistor of claim 1, wherein the organic semiconductor layer comprises a P type organic semiconductor material.

3. The organic thin film transistor of claim 1, wherein the organic semiconductor layer comprises an N type organic semiconductor material.

4. An organic thin film transistor comprising:
   agate electrode;
   an organic semiconductor layer insulated from the gate electrode;
   a source electrode and a drain electrode insulated from the gate electrode and electrically connected to the organic semiconductor layer;
   a first gate insulating layer interposed between the gate electrode and the organic semiconductor layer; and
   a second layer interposed between the first gate insulating layer and the organic semiconductor layer and that comprises a compound having a hole-acceptor group, wherein the compound having the hole-acceptor group comprises at least one selected from the group consisting of poly (3,4-ethylene-dioxythiophene), tetraphenylethylene, 1,2,3,4-tetraphenyl-1,3-cyclopentadiene, and bis(ethylenedithio)tetrathiafulvalene; and
   wherein the second layer interposed between the first gate insulating layer and the organic semiconductor layer entirely contacts the organic semiconductor layer.

5. The organic thin film transistor of claim 4, wherein the organic semiconductor layer comprises a P type organic semiconductor material.

6. A flat panel display device comprising:
   an organic thin film transistor that comprises: a gate electrode; an organic semiconductor layer insulated from the gate electrode; a source electrode and a drain electrode insulated from the gate electrode and electrically connected to the organic semiconductor layer; a first gate insulating layer interposed between the gate electrode and the organic semiconductor layer; and a second layer that is interposed between and entirely contacts the first gate insulating layer and the organic semiconductor layer and that comprises a compound having a hole-donor group, wherein the compound having the hole-donor group is at least one selected from the group consisting of 2,4,7-trinitrofluorenone, 4-nitroaniline, 2,4-dinitroaniline, 5-nitroanthranilonitrile, 2,4-dinitrodiphenylamine, 1,5-dinitronaphthalene, 4-nitrobiphenyl, 4-dimethylamino-4'-nitrostilbene, 1,4-dicyanobenzene, 9,10-dicyanoanthracene, 1,2,4,5-tetracyanobenzene, 3,5-dinitrobenzonitrile, 3,4,9,10-perylenetetracarboxylic dianhydride, N,N'-bis(di-t-butylphenyl)-3,4,9,10-perylenedicarboxyimide), tetrachlorophthalic anhydride, tetrachlorophthalonitrile, tetrafluoro-1,4-benzoquinone, naphthoquinone, phenanthrenequinone, 1,10-phenanthroline-5,6-dione, phenazine, quinoxaline, 2,3,6,7-tetrachloroquinoxaline, and tris-8-hydroxyquinoline aluminum ($Alq_3$).

7. The flat panel display device of claim 6, wherein the organic semiconductor layer comprises a P type organic semiconductor material.

8. The flat panel display device of claim 6, wherein the organic semiconductor layer comprises an N type organic semiconductor material.

9. A flat panel display device comprising:
   an organic thin film transistor that comprises: a gate electrode; an organic semiconductor layer insulated from the gate electrode; a source electrode and a drain electrode insulated from the gate electrode and electrically connected to the organic semiconductor layer; a first gate insulating layer interposed between the gate electrode and the organic semiconductor layer; and a second gate insulating layer interposed between the first gate insulating layer and the organic semiconductor layer that comprises a compound having a hole-acceptor group, wherein the compound having the hole-acceptor group comprises at least one selected from the group consisting of poly (3,4-ethylene-dioxythiophene), tetraphenylethylene, 1,2,3,4-tetraphenyl-1,3-cyclopentadiene, and bis(ethylenedithio)tetrathiafulvalene,
   wherein the second layer interposed between the first gate insulating layer and the organic semiconductor layer entirely contacts the organic semiconductor layer.

* * * * *